US012727147B2

(12) United States Patent
Kosaka

(10) Patent No.: US 12,727,147 B2
(45) Date of Patent: Sep. 1, 2026

(54) SEMICONDUCTOR DEVICE WITH OXIDE SEMICONDUCTOR LAYER FOR MEMORY CELLS

(71) Applicant: Kioxia Corporation, Tokyo (JP)

(72) Inventor: Takao Kosaka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 454 days.

(21) Appl. No.: 18/456,383

(22) Filed: Aug. 25, 2023

(65) Prior Publication Data

US 2024/0074151 A1 Feb. 29, 2024

(30) Foreign Application Priority Data

Aug. 26, 2022 (JP) ................................ 2022-134863

(51) Int. Cl.
*H10B 12/00* (2023.01)

(52) U.S. Cl.
CPC ........... *H10B 12/33* (2023.02); *H10B 12/312* (2023.02); *H10B 12/482* (2023.02); *H10B 12/488* (2023.02)

(58) Field of Classification Search
CPC ...... H10B 12/05; H10B 12/312; H10B 12/33; H10B 12/482; H10B 12/488; H10D 30/67; H10D 30/6755; H10D 86/423
See application file for complete search history.

(56) References Cited

U.S. PATENT DOCUMENTS 10,319,828 B2 6/2019 Shimizu
10,424,675 B2 9/2019 Ohara
11,121,258 B2 9/2021 Kula
11,227,920 B2 1/2022 Yamazaki
11,238,919 B2 2/2022 Wada
2017/0077277 A1 3/2017 Saito
2019/0140080 A1* 5/2019 Lee ........................ H10D 30/63
2020/0111919 A1 4/2020 Karda
2021/0082921 A1 3/2021 Wada
2021/0143284 A1 5/2021 Karda
2021/0249540 A1 8/2021 Hattori
(Continued)

FOREIGN PATENT DOCUMENTS

JP H07193147 A 7/1995
JP 2017055004 A 3/2017
JP 6292507 B2 3/2018
(Continued)

OTHER PUBLICATIONS

V. Nemanic, “Hydrogen permeation barriers: Basic requirements, materials selection, deposition methods, and quality evaluation”, Nuclear Materials and Energy, vol. 19, May 2019, pp. 451-457, DOI: https://doi.org/10.1016/j.nme.2019.04.001.
(Continued)

*Primary Examiner* — Hoai V Pham

(74) *Attorney, Agent, or Firm* — Kim & Stewart LLP

(57) ABSTRACT

According to one embodiment, a semiconductor device includes a conductive layer, an oxide semiconductor layer provided penetrating the conductive layer in a first direction, and a first insulating film provided between the conductive layer and the oxide semiconductor layer in a second direction that intersects the first direction. The first insulating film comprises boron nitride.

21 Claims, 13 Drawing Sheets

(56) References Cited

U.S. PATENT DOCUMENTS

| | | | | |
|---|---|---|---|---|
| 2021/0305431 | A1 | 9/2021 | Ishimaru | |
| 2024/0023306 | A1* | 1/2024 | Kang .................. | H10B 12/053 |

FOREIGN PATENT DOCUMENTS

| | | | |
|---|---|---|---|
| JP | 2018133404 | A | 8/2018 |
| JP | 6659283 | B2 | 3/2020 |
| JP | 2022502865 | A | 1/2022 |
| WO | 2018224904 | A1 | 5/2020 |

OTHER PUBLICATIONS

A. Santucci et al., "Alternatives to palladium in membranes for hydrogen separation: nickel, niobium and vanadium alloys, ceramic supports for metal alloys and porous glass membranes", Handbook of Membrane Reactors, Fundamental Materials Science, Design and Optimisation, vol. 1 in Woodhead Publishing Series in Energy, 2013, pp. 183-217, DOI: 10.1533/9780857097330.1.183.

Y. Chang et al., "Abnormal positive bias stress instability of In—Ga—Zn—O thin-film transistors with low-temperature Al203 gate dielectric", Applied Physics Letters 108, 033502, 2016 (published online Jan. 19, 2016), URL: https://doi.org/10.1063/1.4939905.

K. Namba et al., "Acceleration of hydrogen absorption by palladium through surface alloying with gold", PNAS, vol. 115, No. 31, Jul. 31, 2018, pp. 7896-7900, URL: www.pnas.org/cgi/doi/10.1073/pnas.1800412115.

S. Hu et al., "Proton transport through one-atom-thick crystals", Nature, vol. 516, Dec. 11, 2014, pp. 227-230, DOI: https://doi.org/10.1038/nature14015.

M. Mitomo, "Material development in SiAION", Bulletin of the Japan Institute of Metals, vol. 24, No. 10, 1985, 19 pages (with translation).

* cited by examiner 51
45
42
41
431
432
44
32
Y
X
Z 401
45
42
431
432
44
32
Y
X
Z 401
45
422
424
42
423
421
44
Y
X
Z
32
321
322

45
422
424
42
41
433
431
423
421
44
Y
X
Z
32
321
322

SEMICONDUCTOR DEVICE WITH OXIDE SEMICONDUCTOR LAYER FOR MEMORY CELLS

CROSS-REFERENCE TO RELATED APPLICATION(S)

This application is based upon and claims the benefit of priority from Japanese Patent Application No. 2022-134863, filed Aug. 26, 2022, the entire contents of which are incorporated herein by reference.

FIELD

Embodiments described herein relate generally to a semiconductor device.

BACKGROUND

Semiconductor storage devices having bit lines, word lines, and memory cells (transistors and capacitors) connected to these, are being used. Data can be written into and read from a memory cell by selecting a bit line and a word line, and applying a voltage.

DETAILED DESCRIPTION

Figure 1:
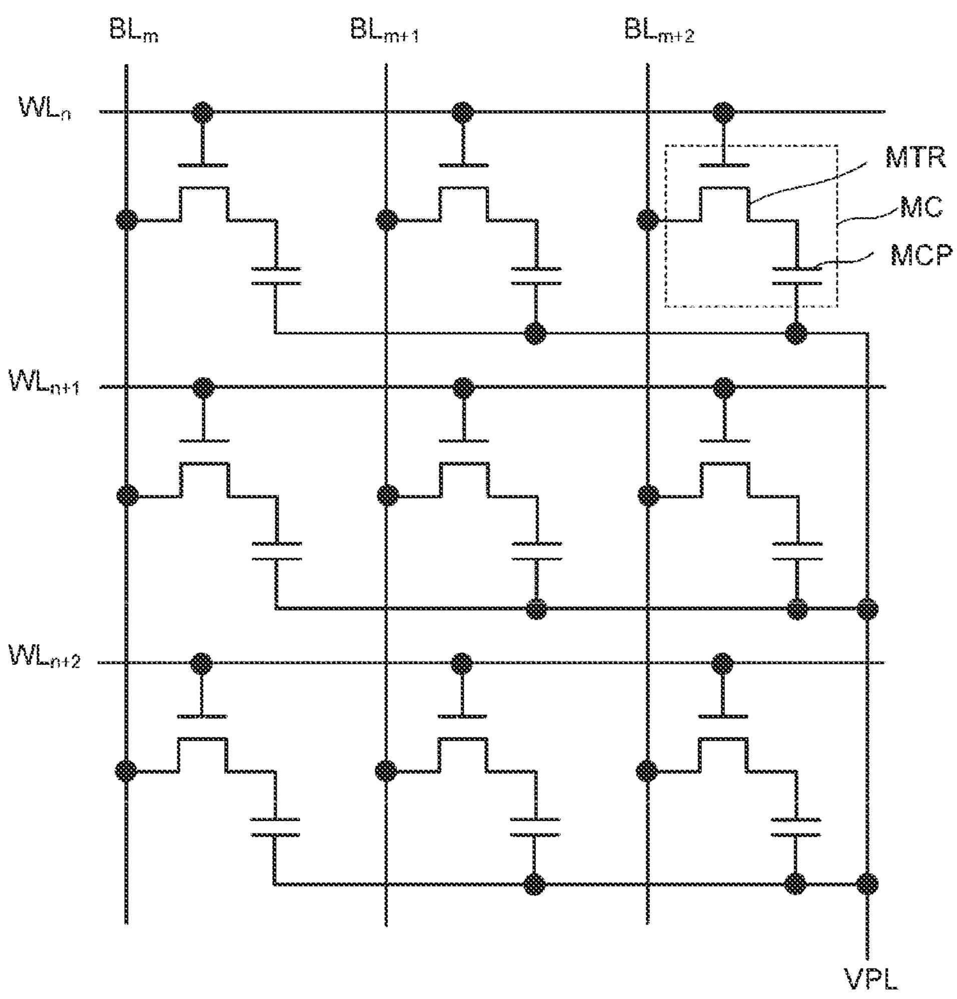
FIG. 1 is a circuit diagram illustrating an example of a memory cell array circuit configuration.

Embodiments provide a method for avoiding a decrease in reliability of a semiconductor device.

In general, according to one embodiment, a semiconductor device includes a conductive layer, an oxide semiconductor layer penetrating the conductive layer in a first direction, and a first insulating film. The first insulating film is provided between the conductive layer and the oxide-semiconductor layer in a second direction that intersects the first direction and comprises boron nitride.

Hereafter, certain example embodiments will be described with reference to the drawings. It is noted that depicted relationships between a thickness and a planar dimension of components shown in the drawings, a ratio of thicknesses among components, and the like, may differ from those of actual components. An up-down direction may differ from an up-down direction that accords with gravitational acceleration. Also, in the various embodiments, identical reference signs are allotted to substantially identical components, and a description thereof is omitted as appropriate.

In the specification, "connection" includes not only a physical connection but also an electrical connection, and, unless specified otherwise, includes not only a direct connection but also an indirect connection.

A semiconductor device of an embodiment is a dynamic random-access memory (DRAM) with a memory cell array.

FIG. 1 is a circuit diagram illustrating an example of a memory cell array circuit configuration. FIG. 1 shows multiple memory cells MC, multiple word lines WL (a word line $WL_n$, a word line $WL_{n+1}$, and a word line $WL_{n+2}$, wherein n is an integer), multiple bit lines BL (a bit line $BL_m$, a bit line $BL_{m+1}$, and a bit line $BL_{m+2}$, wherein m is an integer), and a power supply line VPL.

The multiple memory cells MC are arranged in a matrix forming a memory cell array. Each memory cell MC includes a memory transistor MTR, which is a field-effect transistor (FET), and a memory capacitor MCP. A gate of the memory transistor MTR is connected to a corresponding word line WL, and one of a source or a drain is connected to a corresponding bit line BL. The word line WL is connected to, for example, a row decoder. The bit line BL is connected to, for example, a sense amplifier. A first electrode of the memory capacitor MCP is connected to the other of the source and the drain of the memory transistor MTR, and a second electrode is connected to the power supply line VPL, which supplies a specific potential. The power supply line VPL is connected to, for example, a power supply circuit. The memory cell MC can store data by accumulating a charge from the bit line BL in the memory capacitor MCP using a switching of the memory transistor MTR by the word line WL. The number of the memory cells MC is not limited to the number shown in FIG. 1.

Figure 2:
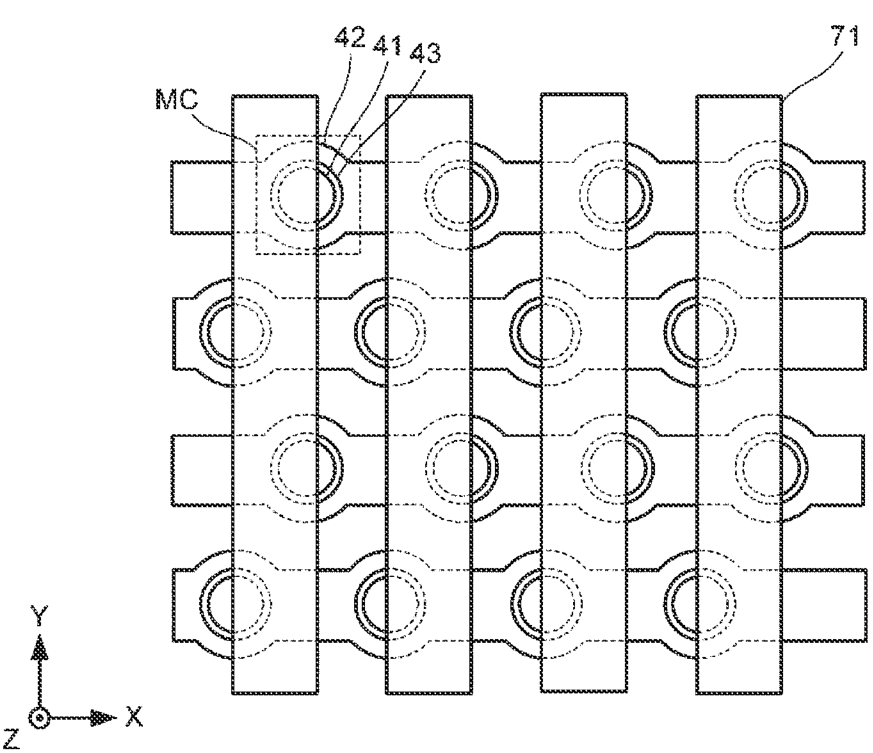
FIG. 2 is a planar schematic view illustrating an example of a memory cell array structure.
Figure 3:
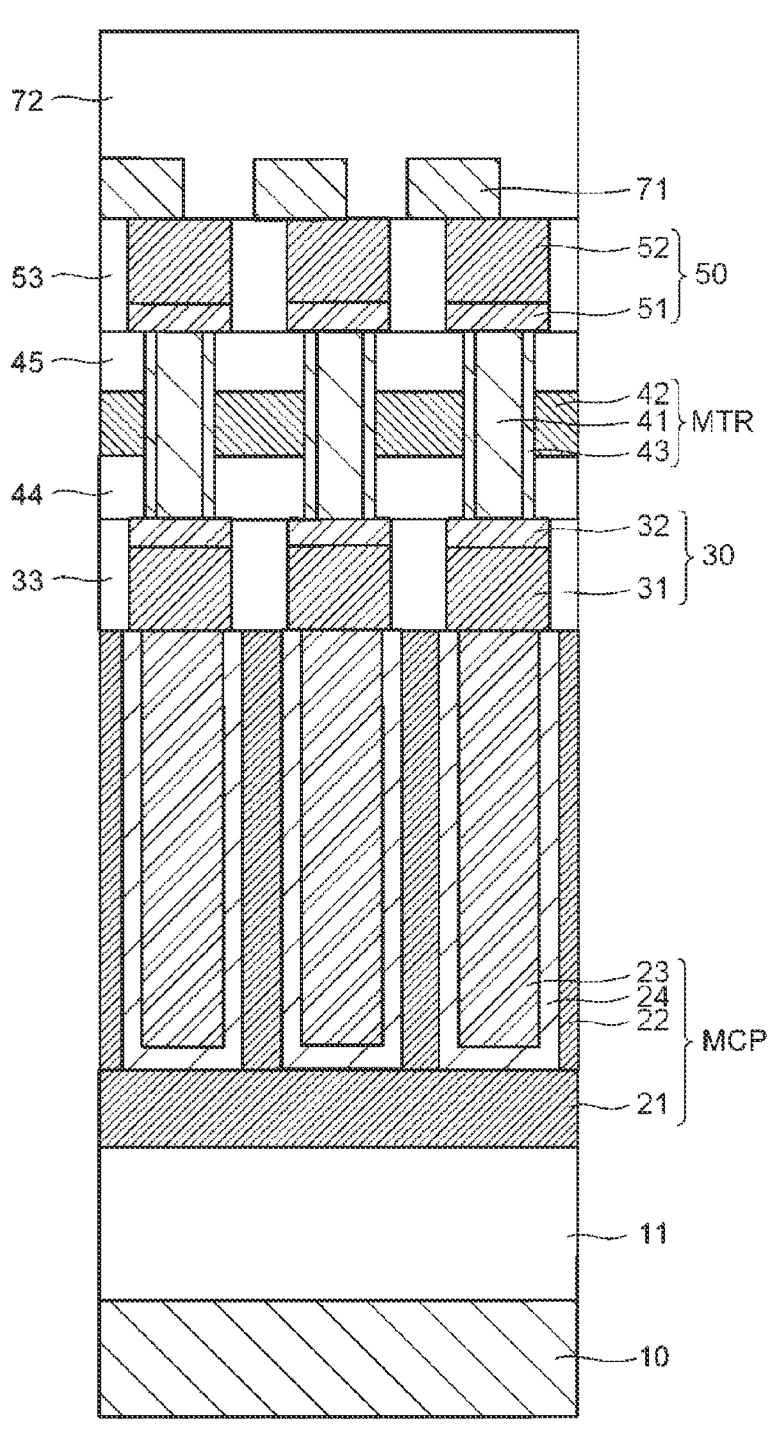
FIG. 3 is a cross-sectional schematic view illustrating an example of a memory cell array structure.
Figure 3:
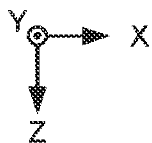

FIG. 2 is a planar schematic view illustrating an example of a memory cell array structure. FIG. 3 is a cross-sectional schematic view illustrating an example of the memory cell array structure. FIGS. 2 and 3 show an X axis, a Y axis, and a Z axis. The X axis, the Y axis, and the Z axis are perpendicular to each other. FIG. 2 shows one portion of an X-Y plane. FIG. 3 shows one portion of an X-Z cross-section.

The memory cell array includes a conductor 21, a conductive layer 22, an electrical conductor 23, an insulator 24, a conductive layer 31, a conductive oxide layer 32, an oxide semiconductor layer 41, a conductive layer 42, an insulating film 43, a conductive oxide layer 51, a conductive layer 52, and a conductive layer 71. For the sake of convenience, FIG. 2 shows the oxide semiconductor layer 41, the conductive layer 42, the insulating film 43, and the conductive layer 71, while other components are omitted from the drawing for the sake of explanatory convenience.

As shown in FIG. 3, the memory transistor MTR and the memory capacitor MCP are provided above the insulating layer 11 on a semiconductor substrate 10. Peripheral circuits such as a row decoder, a sense amplifier, and a power supply circuit are formed in the semiconductor substrate 10. A peripheral circuit has a field-effect transistor such as a P-channel field-effect transistor (Pch-FET) or an N-channel field-effect transistor (Nch-FET). A field-effect transistor is formed using the semiconductor substrate 10, which is a single-crystal silicon substrate or the like, and a Pch-FET and an Nch-FET have a channel region, a source region, and a drain region in the semiconductor substrate 10. The semiconductor substrate 10 may have P-type conductivity. The insulating layer 11 is formed on the semiconductor substrate 10, and includes, for example, silicon (Si), oxygen (O), and/or nitrogen (N). The insulating layer 11 may be a multi-layered film.

The conductor 21, the conductive layer 22, the electrical conductor 23, and the insulator 24 form the memory capacitor MCP. The memory capacitor MCP is a three-dimensional capacitor such as a so-called pillar-type capacitor or a cylindrical capacitor.

The conductor 21 is provided above the semiconductor substrate 10 across (covering) the insulating layer 11. The conductive layer 22 is provided on one portion of the conductor 21. The conductor 21 and the conductive layer 22 form the second electrode of the memory capacitor MCP. The conductor 21 extends in such a way as to overlap the multiple electrical conductors 23 when seen from the Z axis direction. The conductor 21 is also called a plate electrode. The electrical conductor 23 is provided above the conductor 21 across the insulator 24, extends in the Z direction, and forms the first electrode of the memory capacitor MCP. The insulator 24 is provided between the conductor 21 and conductive layer 22 and the electrical conductor 23, and forms a dielectric of the memory capacitor MCP.

The conductor 21 and the conductive layer 22 comprise a material such as tungsten or titanium nitride. The electrical conductor 23 comprises a material such as tungsten, titanium nitride, or amorphous silicon. The insulator 24 comprises a material such as hafnium oxide, zirconium oxide, or aluminum oxide.

The conductive layer 31 is provided on the electrical conductor 23 and is electrically connected to the electrical conductor 23. The conductive layer 31 comprises, for example, copper. The conductive layer 31 need not necessarily be formed in all examples.

The conductive oxide layer 32 is provided on the conductive layer 31. The conductive oxide layer 32 comprises a metal oxide such as indium tin oxide (ITO).

The conductive layer 31 and the conductive oxide layer 32 form the conductor 30. The multiple conductors 30 are provided with respect to the multiple electrical conductors 23. The insulating layer 33 is formed among the multiple conductors 30. The insulating layer 33 comprises, for example, silicon and oxygen or silicon and nitrogen.

The oxide semiconductor layer 41, the conductive layer 42, and the insulating film 43 form the memory transistor MTR. The memory transistor MTR is, for example, an N-channel field-effect transistor. The memory transistor MTR is provided above the memory capacitor MCP. The multiple memory transistors MTR are provided corresponding to the multiple memory capacitors MCP. An insulating layer 44 and an insulating layer 45 are formed among the multiple memory transistors MTR. The insulating layer 44 and the insulating layer 45 include, for example, silicon and oxygen or silicon and nitrogen.

The oxide semiconductor layer 41 is a columnar body extending in, for example, the Z axis direction. The oxide semiconductor layer 41 penetrates the conductive layer 42 in the Z axis direction. The oxide semiconductor layer 41 forms a channel of the memory transistor MTR. The oxide semiconductor layer 41 comprises, for example, indium (In). The oxide semiconductor layer 41 comprises, for example, indium oxide and gallium oxide, indium oxide and zinc oxide, or indium oxide and tin oxide. As one example, the oxide semiconductor layer 41 comprises an oxide including indium, gallium, and zinc (indium gallium zinc oxide), so-called IGZO (InGaZnO).

One end of the oxide semiconductor layer 41 in the Z axis direction is connected to the conductive layer 31 across the conductive oxide layer 32, and functions as the other of the source and the drain of the memory transistor MTR. The conductive oxide layer 32 is provided between the electrical conductor 23 of the memory capacitor MCP and the oxide semiconductor layer 41 of the memory transistor MTR, and functions as the other of a source electrode and a drain electrode of the memory transistor MTR. The conductive oxide layer 32 comprises a metal oxide, in the same way as the oxide semiconductor layer 41 of the memory transistor MTR, because of which connection resistance between the memory transistor MTR and the memory capacitor MCP can be reduced.

The conductive layer 42 includes a portion that opposes the oxide semiconductor layer 41 across the insulating film 43 in an X-Y plane. The conductive layer 42 forms a gate electrode of the memory transistor MTR, and forms the word line WL as wiring. The conductive layer 42 comprises, for example, a metal, a metal alloy, or a semiconductor. The conductive layer 42 includes at least one material chosen from the group of tungsten (W), titanium (Ti), titanium nitride (TiN), molybdenum (Mo), cobalt (Co), and ruthenium (Ru).

In FIG. 2, the conductive layer 42 is such that when seen from the Y axis direction, a width in the Y axis direction of a region that does not overlap the memory transistor MTR is smaller than that of a region overlapping the memory transistor MTR, however in some examples, widths in the Y axis direction of the conductive layer may be of a constant value.

As shown in FIG. 2, the multiple conductive layers 42 extend in the X axis direction, and are disposed parallel to each other. Each conductive layer 42 overlaps the multiple memory cells MC in the X axis direction, and is connected thereto.

The insulating film 43 is provided between the oxide semiconductor layer 41 and the conductive layer 42 in the X-Y plane. The insulating film 43 forms a gate insulating film of the memory transistor MTR. The insulating film 43 comprises, for example, silicon and oxygen or silicon and nitrogen. The insulating film 43 may be a multi-layered film comprising multiple insulating films.

The memory transistor MTR is a so-called surrounding gate transistor (SGT) wherein a gate electrode is disposed enclosing a channel. An area of a semiconductor device can be reduced owing to an SGT.

A field-effect transistor having a channel layer that comprises an oxide semiconductor is such that an off-state leakage current is smaller than that of a field-effect transistor provided on the semiconductor substrate 10. Therefore, for example, data in the memory cell MC can be stored longer, because of which the number of refresh operations can be reduced. Also, a field-effect transistor having a channel layer that comprises an oxide semiconductor can be formed using a low-temperature process, because of which an application of thermal stress to the memory capacitor MCP can be restricted.

The conductive oxide layer 51 is provided on the oxide semiconductor layer 41. The conductive oxide layer 51 comprises a metal oxide such as indium tin oxide (ITO).

The conductive layer 52 is provided on the conductive oxide layer 51, and is electrically connected to the conductive oxide layer 51. The conductive layer 52 comprises, for example, copper.

The conductive oxide layer 51 and the conductive layer 52 form the conductor 50. The conductor 50 is electrically connected to a sense amplifier via the bit line BL. The conductor 50 has a function as, for example, a conductive pad for connecting the memory transistor MTR and the bit line BL. The multiple conductors 50 are provided corresponding to the multiple memory transistors MTR. The insulating layer 53 is formed among the multiple conductors 50. The insulating layer 53 comprises, for example, silicon and oxygen or silicon and nitrogen.

The other end in the Z axis direction of the oxide semiconductor layer 41 is connected to the conductive layer 52 across the conductive oxide layer 51, and functions as one of the source or the drain of the memory transistor MTR. The conductive oxide layer 51 functions as one of the source electrode or the drain electrode of the memory transistor MTR. The conductive oxide layer 51 comprises a metal oxide in the same way as the oxide semiconductor layer 41 of the memory transistor MTR, because of which connection resistance between the memory transistor MTR and the bit line BL can be reduced.

The conductive layer 71 is provided on the conductive layer 52, and is connected to the conductor 50. The conductive layer 71 forms the bit line BL as wiring. An insulating layer 72 is formed among the multiple conductive layers 71. The insulating layer 72 comprises, for example, silicon and oxygen or silicon and nitrogen.

As shown in FIG. 2, the multiple conductive layers 71 (bit lines BL) extend in the Y axis direction, and are disposed parallel to each other. Each conductive layer 71 overlaps the multiple memory cells MC when seen from the Z axis direction, and is connected thereto.

The multiple memory cells MC may form a staggered disposition in the X-Y plane, as shown in FIG. 2. The memory cell MC connected to one of the multiple word lines WL is disposed deviating in the X axis direction with respect to the memory cell MC connected to the neighboring word line WL. Because of this, a degree of integration of the memory cells MC can be increased.

In the case of the structure example shown in FIG. 3, there is a problem in that a threshold voltage of the memory transistor MTR is liable to shift. A threshold voltage shift is a cause of a malfunction of the memory transistor MTR, and causes reliability of a semiconductor storage device to decrease.

Diffusion/infiltration of hydrogen into the oxide semiconductor layer 41 is suggested as one cause of a threshold voltage shift. It is conceivable that hydrogen infiltrates the oxide semiconductor layer 41 from at least one of the insulating film 43, the insulating layer 44, and the insulating layer 45.

Hydrogen in the oxide semiconductor layer 41 reacts with oxygen, causing an oxygen deficiency locally. Electrons, which are carriers, may be generated by hydrogen entering the oxygen deficiency. Also, electrons, which are carriers, may be generated by one portion of the hydrogen bonding with oxygen that bonds with metal atoms. Because of this, the threshold voltage of the memory transistor MTR shifts in a negative direction.

The memory cell array of the semiconductor device of the present embodiment has a protective film that has a function of restricting infiltration (diffusion) of hydrogen into the oxide semiconductor layer 41. Because of this, a decrease in reliability of the semiconductor device can be restricted. A specific example of a structure of a memory cell array having a protective film will be described hereafter.

First Example of Memory Cell Array Structure

Figures 4, 5:
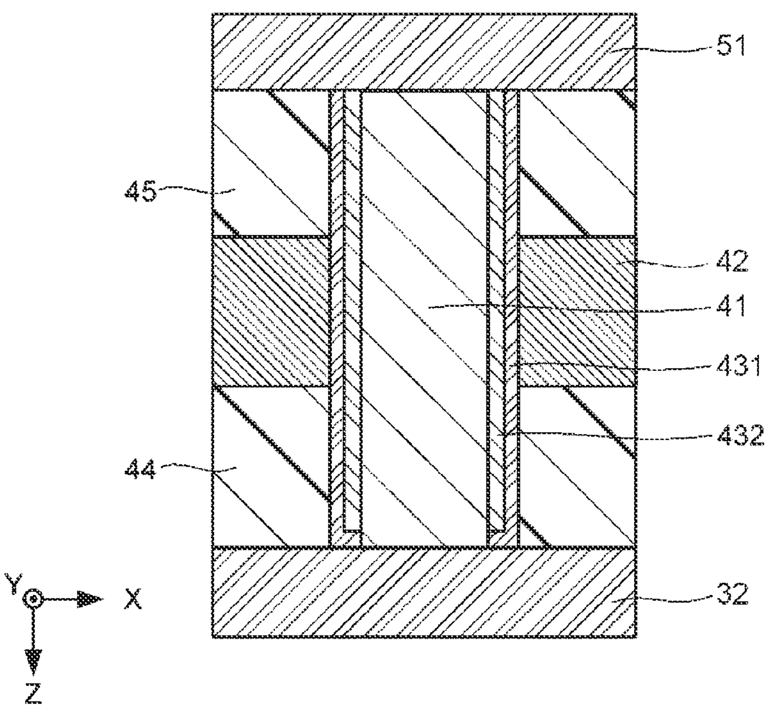
FIG. 4 is a cross-sectional schematic view illustrating a first example of a memory cell array structure.
FIG. 5 is a cross-sectional schematic view illustrating the first example of a memory cell array structure.

FIG. 4 is a cross-sectional schematic view illustrating a first example of a memory cell array structure. FIG. 4 shows one portion of an X-Z section including the memory transistor MTR. Hereafter, a portion differing from the memory cell array shown in FIG. 3 will be described, while the description of FIG. 3 may be referred to as appropriate regarding other portions.

The first example of the memory cell array structure includes an insulating film 431 and an insulating film 432 instead of the insulating film 43 shown in FIG. 3. The insulating film 431 and the insulating film 432 form a gate insulating film of the memory transistor MTR.

The insulating film 431 is provided between the oxide semiconductor layer 41 and the conductive layer 42. The insulating film 431 encloses the oxide semiconductor layer 41. The insulating film 431 comprises, for example, oxygen and silicon, aluminum, or hafnium. The insulating film 431 is, for example, a silicon oxide film, an aluminum oxide film, or a hafnium oxide film. A thickness of the insulating film 431 is preferably 1 nm to 10 nm. The insulating film 431 need not necessarily be provided in some examples.

The insulating film 432 is provided between the oxide semiconductor layer 41 and the insulating film 431. The insulating film 432 encloses the oxide semiconductor layer 41, and is enclosed by the insulating film 431. The insulating film 432 has a function as a protective film for restricting infiltration (diffusion) of hydrogen into the oxide semiconductor layer 41. A thickness of the insulating film 432 is preferably 0.5 nm to 3 nm.

The insulating film 432 comprises nitrogen and boron. The insulating film 432 is a film having, for example, hexagonal crystal boron nitride (hBN). As a hydrogen diffusion coefficient of hexagonal crystal boron nitride is lower than that of the insulating film 431, infiltration of hydrogen into the oxide semiconductor layer 41 from the insulating film 432, the insulating layer 44, and the insulating layer 45 can be reduced. An infiltration of hydrogen into the oxide semiconductor layer 41 can be effectively restricted by, for example, four or more layers of hexagonal crystal boron nitride being stacked.

Hexagonal crystal boron nitride can avoid an oxygen deficiency by restricting the infiltration of hydrogen. Also, as an oxygen diffusion coefficient of hexagonal crystal boron nitride is lower than that of the insulating film 431, a loss of oxygen from the oxide semiconductor layer 41 can be restricted.

The insulating film 431 may extend between the insulating film 432 and the conductive oxide layer 32 in the X-Y plane direction from a Z axis direction lower end in contact with the conductive oxide layer 32, as shown in FIG. 5. By adopting the heretofore described structure, the insulating film 431 and the insulating film 432 can be processed in the same process by being formed continuously by which a manufacturing process can be simplified.

The first structure example is such that infiltration of hydrogen into the oxide semiconductor layer 41 can be reduced by the insulating film 432. Also, a loss of oxygen from the oxide semiconductor layer 41 can be limited by the insulating film 432. Because of this, a shift in the threshold voltage of the memory transistor MTR can be restricted.

Next, an example of a method of manufacturing the first structure example will be described, with reference to FIGS. 6 to 11. FIGS. 6 to 11 are cross-sectional schematic views illustrating an example of a method of manufacturing the first structure example. FIGS. 6 to 11 show one portion of an X-Z section. Herein, a manufacturing process from forming the memory capacitor MCP to forming the memory transistor MTR will be described.

Figure 6:
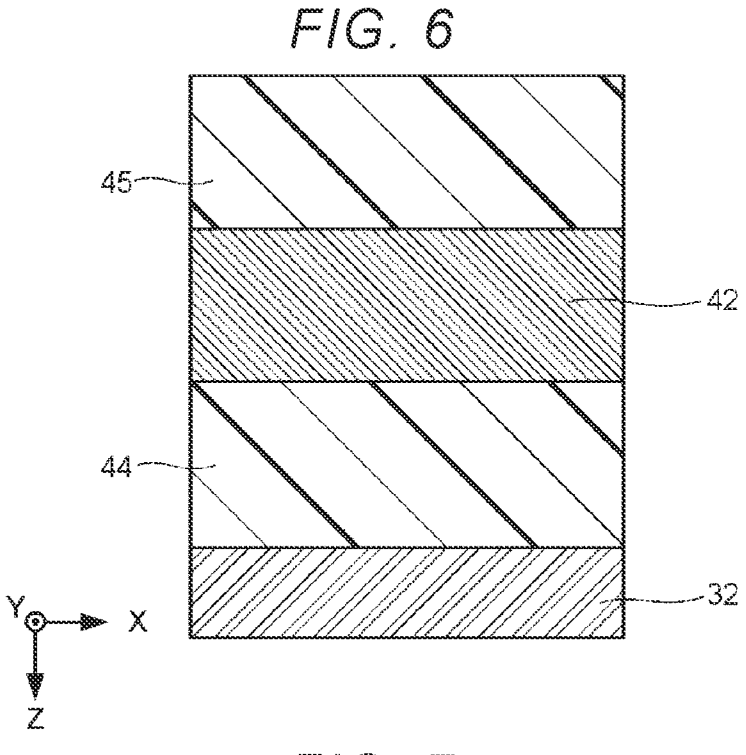
FIGS. 6 to 11 are cross-sectional schematic views illustrating an example of a method of manufacturing a first structure example.

As shown in FIG. 6, the insulating layer 44, the conductive layer 42, and the insulating layer 45 are formed sequentially on the conductive oxide layer 32. The conductive oxide layer 32 is formed using, for example, sputtering or atomic layer deposition (ALD). The conductive layer 42 is formed by, after forming a conductive film using, for example, sputtering or ALD, partially removing the conductive film by, for example, an etching in which a resist mask is used. The insulating layer 44 and the insulating layer 45 are formed using, for example, chemical vapor deposition (CVD) or ALD.

Figure 7:
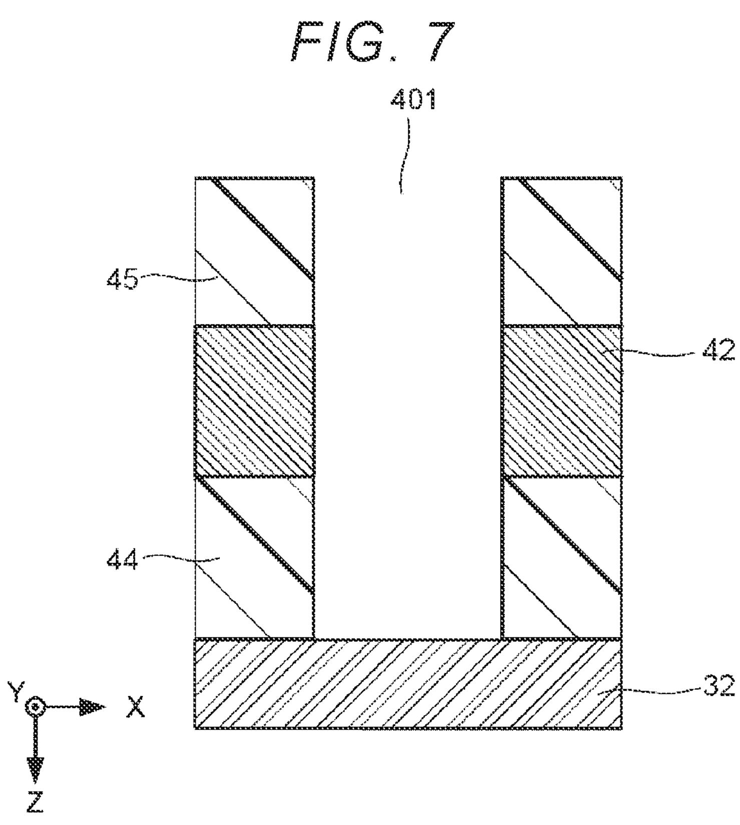

Next, as shown in FIG. 7, an upper face of the conductive oxide layer 32 is partially exposed by forming an aperture 401 that penetrates a layered body of the insulating layer 44, the conductive layer 42, and the insulating layer 45 in the Z axis direction. The aperture 401 is formed by partially removing the layered body in a thickness direction by, for example, an etching in which a resist mask is used.

Figure 8:
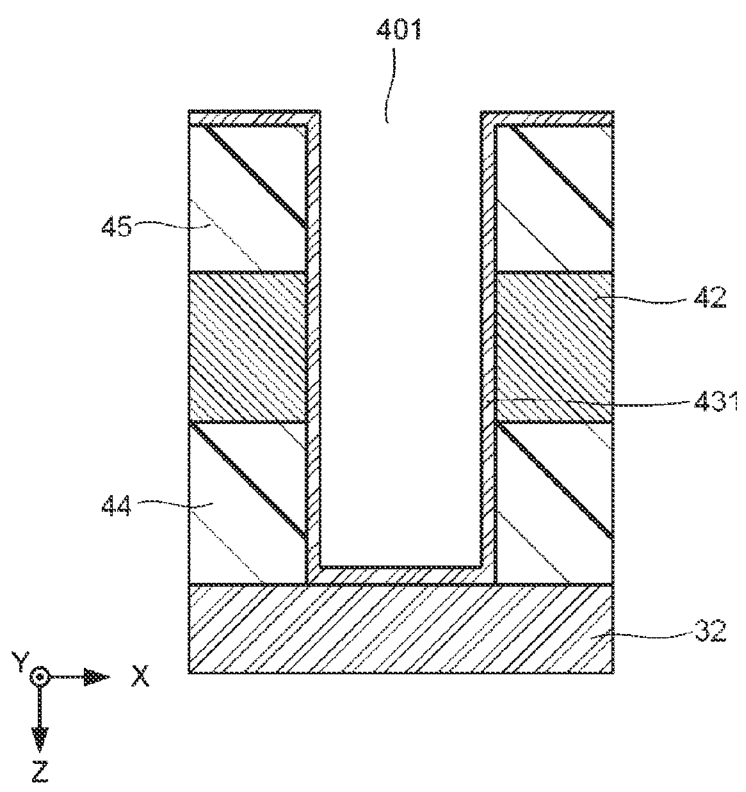

Next, as shown in FIG. 8, the insulating film 431 is formed on an inner face of the aperture 401. The insulating film 431 is formed using, for example, CVD or ALD.

Figure 9:
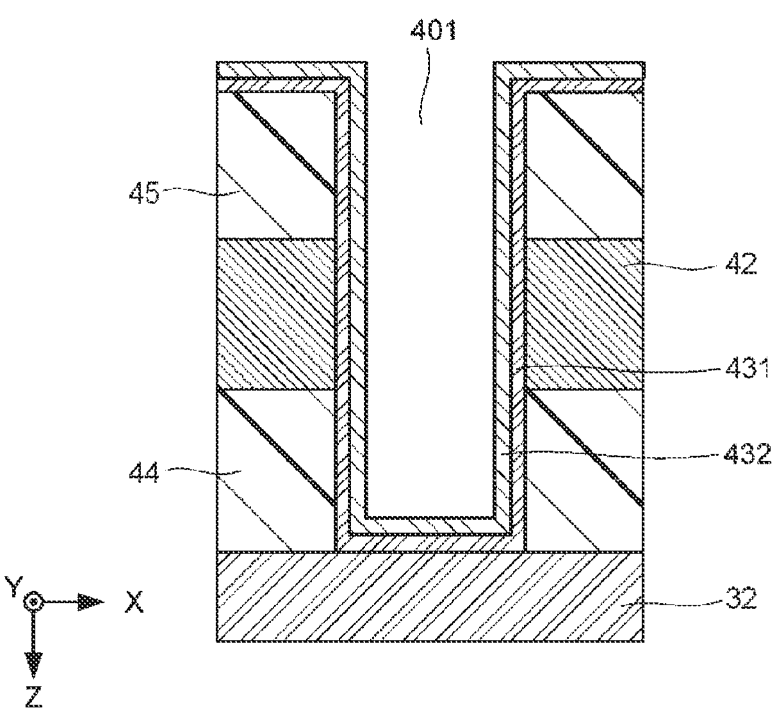

Next, as shown in FIG. 9, the insulating film 432 is formed on the insulating film 431. The insulating film 432 is formed using, for example, CVD or ALD.

Figures 10, 11:
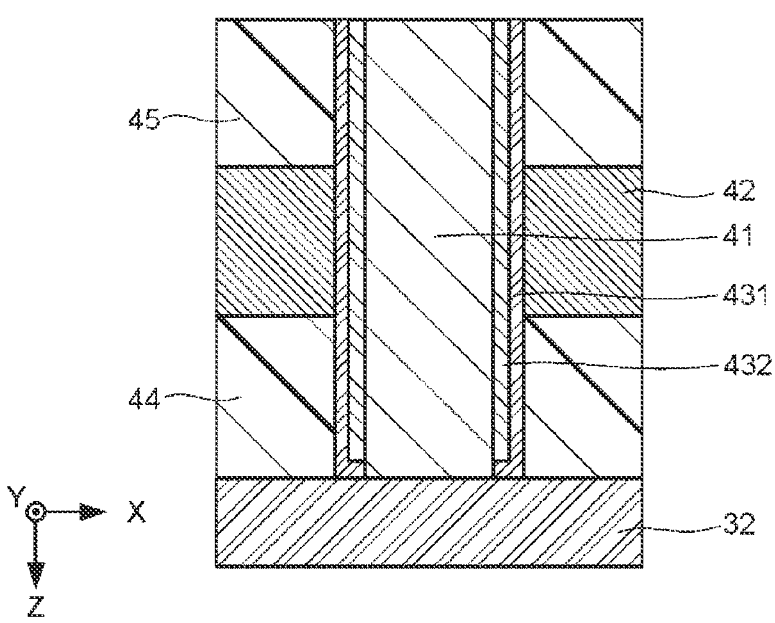

Next, as shown in FIG. 10, the upper face of the conductive oxide layer 32 and the upper face of the insulating layer 45 are caused to be partially exposed by partially removing the insulating film 431 and the insulating film 432 in a thickness direction using reactive-ion etching (RIE).

Next, as shown in FIG. 11, the oxide semiconductor layer 41, which fills the aperture 401, is formed. The oxide semiconductor layer 41 is formed by, after forming an oxide semiconductor film in the aperture 401 using, for example, sputtering or ALD, causing the upper face of the insulating layer 45 to be exposed by partially removing the oxide semiconductor film in a thickness direction using RIE.

Subsequently, the conductive oxide layer 51 is formed on the oxide semiconductor layer 41. The conductive oxide layer 51 can be formed using, for example, sputtering or ALD. The above is a description of an example of a method of manufacturing the first structure example.

Modification of First Structure Example

Figure 12:
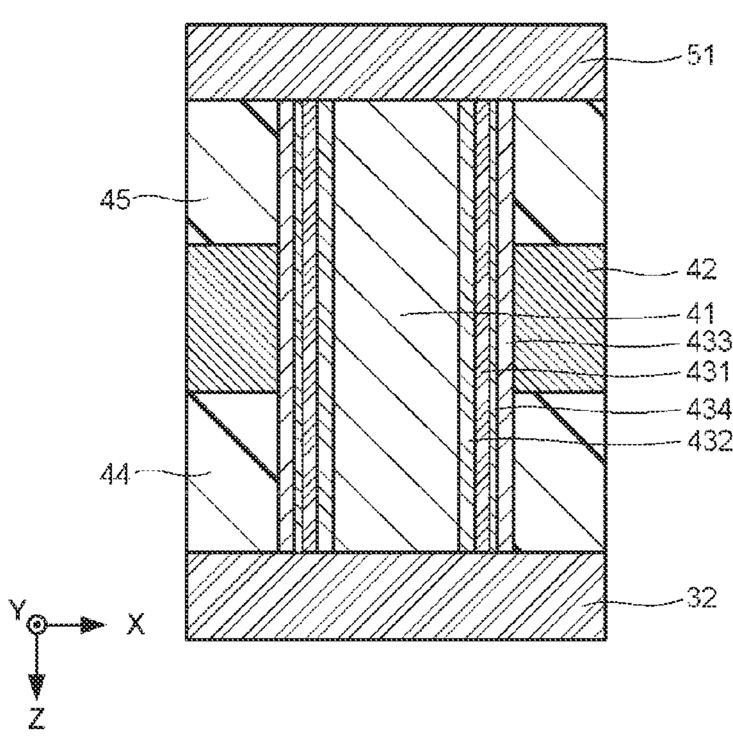
FIG. 12 is a cross-sectional schematic view illustrating a modification of the first structure example.

FIG. 12 is a cross-sectional schematic view illustrating a modification of the first structure example. FIG. 12 shows one portion of an X-Z section including the memory transistor MTR. The memory cell array shown in FIG. 12 further includes, in addition to the configuration shown in FIG. 4, an insulating film 433 and an insulating film 434. The insulating film 431, the insulating film 432, the insulating film 433, and the insulating film 434 form a gate insulating film of the memory transistor MTR. Hereafter, a portion differing from FIG. 4 will be described, while the description of FIG. 4 may be referred to as appropriate regarding other portions.

The insulating film 433 is provided between the conductive layer 42 and the insulating film 431. The insulating film 433 encloses the insulating film 431. The insulating film 433 comprises, for example, silicon and nitrogen. The insulating film 433 is, for example, a silicon nitride film. A thickness of the insulating film 433 is preferably 1 nm to 5 nm.

The insulating film 434 is provided between the insulating film 431 and the insulating film 433. The insulating film 434 encloses the insulating film 431. The insulating film 434 comprises, for example, silicon, aluminum, oxygen, and nitrogen. The insulating film 434 is, for example, a film of silicon aluminum oxynitride (SiAlON). A thickness of the insulating film 434 is preferably 1 nm to 3 nm. Positions of the insulating film 431 and the insulating film 433 may be switched. For example, the insulating film 431 may be provided on a surface on an outer side (the conductive layer 42 side) of the insulating film 434, and the insulating film 433 provided on a surface on an inner side (the oxide semiconductor layer 41 side) of the insulating film 434. Also, at least one of the insulating film 431 and the insulating film 433 need not necessarily be provided. Further still, the insulating film 432 may be provided between the insulating film 431 and the insulating film 433, and between the insulating film 434 and the conductive layer 42.

A hydrogen diffusion coefficient of SiAlON is lower than that of silicon oxide or silicon nitride. Therefore, a hydrogen diffusion coefficient of the insulating film 434 can be lower than a hydrogen diffusion coefficient of each of the insulating film 431 and the insulating film 433. Therefore, infiltration of hydrogen into the oxide semiconductor layer 41 can be effectively reduced. Because of this, a shift in the threshold voltage of the memory transistor MTR can be restricted.

Figure 13:
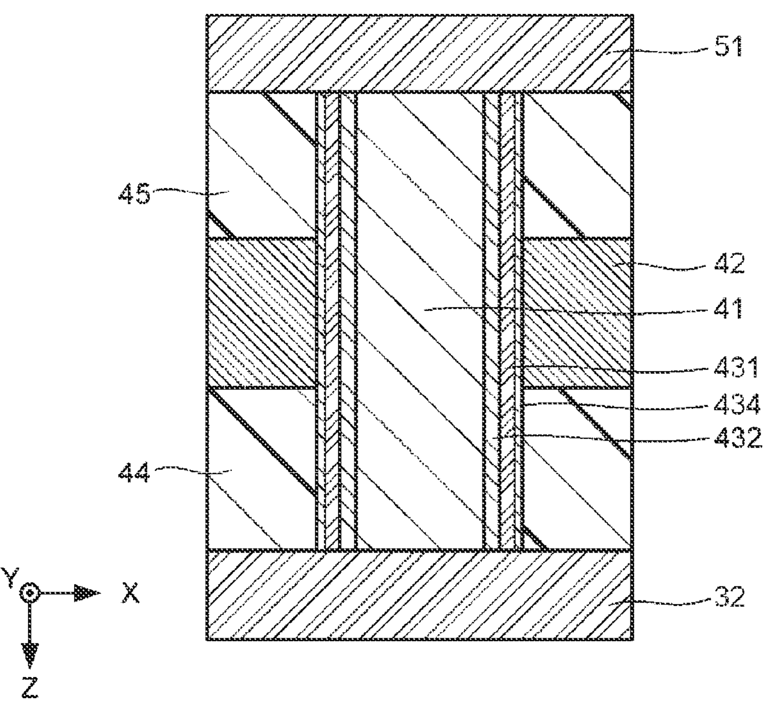
FIG. 13 is a cross-sectional schematic view illustrating the modification of the first structure example.

Adhesion can be increased by providing the insulating film 431 between the insulating film 434 and the oxide semiconductor layer 41. Also, the insulating film 434 may be formed between the conductive layer 42 and the insulating film 431, without forming the insulating film 433, as shown in FIG. 13. By so doing, the gate insulating film can be reduced in thickness.

Figures 14, 15:
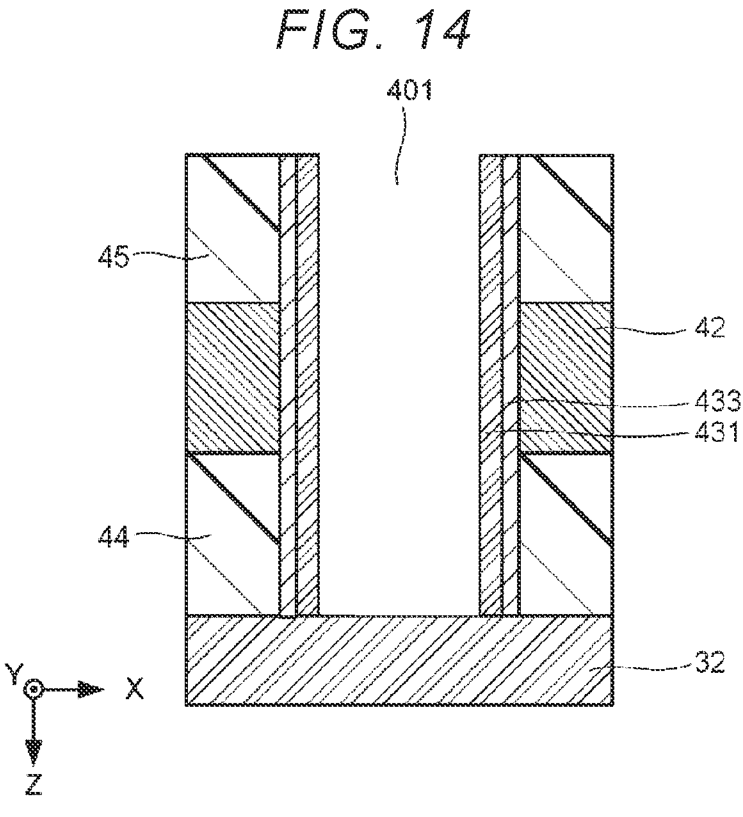
FIG. 14 is a cross-sectional schematic view illustrating an example of a method of manufacturing the modification of the first structure example.
FIG. 15 is a cross-sectional schematic view illustrating an example of a method of manufacturing the modification of the first structure example.

Next, an example of a method of manufacturing the modification of the first structure example will be described, with reference to FIGS. 14 and 15. FIGS. 14 and 15 are cross-sectional schematic views illustrating an example of a method of manufacturing the modification of the first structure example. FIGS. 14 and 15 show one portion of an X-Z section. Herein, a manufacturing process from forming the memory capacitor MCP to forming the memory transistor MTR will be described.

After forming the insulating layer 44, the conductive layer 42, the insulating layer 45, and the aperture 401 through processes the same as in FIGS. 6 and 7, the insulating film 433 and the insulating film 431 are formed in the aperture 401, as shown in FIG. 14. The insulating film 431 and the insulating film 433 are formed initially by, for example, CVD or ALD, and then by causing the upper face of the conductive oxide layer 32 and the upper face of the insulating layer 45 to be partially exposed by partially removing the insulating film 431 and the insulating film 433 in a thickness direction using RIE. In FIG. 14, the insulating film 431 is an aluminum oxide film, and the insulating film 433 is a silicon nitride film.

Next, the insulating film 434 is formed between the insulating film 431 and the insulating film 433, as shown in FIG. 15, by carrying out heat treatment and causing the insulating film 431 and the insulating film 433 to react. The heat treatment is carried out, for example, at a temperature of 600° C. or higher for 60 minutes or longer in an atmosphere including hydrogen and nitrogen.

When the insulating film 433 is not yet formed, as shown in FIG. 13, the insulating film 434 is formed by forming a film having SiAlON on the inner face of the aperture 401 using, for example, CVD or ALD, and causing the upper face of the conductive oxide layer 32 and the upper face of the insulating layer 45 to be partially exposed by partially removing the film having SiAlON in a thickness direction using RIE.

Subsequently, through processes the same as described for FIGS. 9 to 11, the oxide semiconductor layer 41 is formed, and the conductive oxide layer 51 is formed on the oxide semiconductor layer 41. The above is a description of an example of a method of manufacturing the modification of the first structure example.

Second Example of Memory Cell Array Structure

Figure 16:
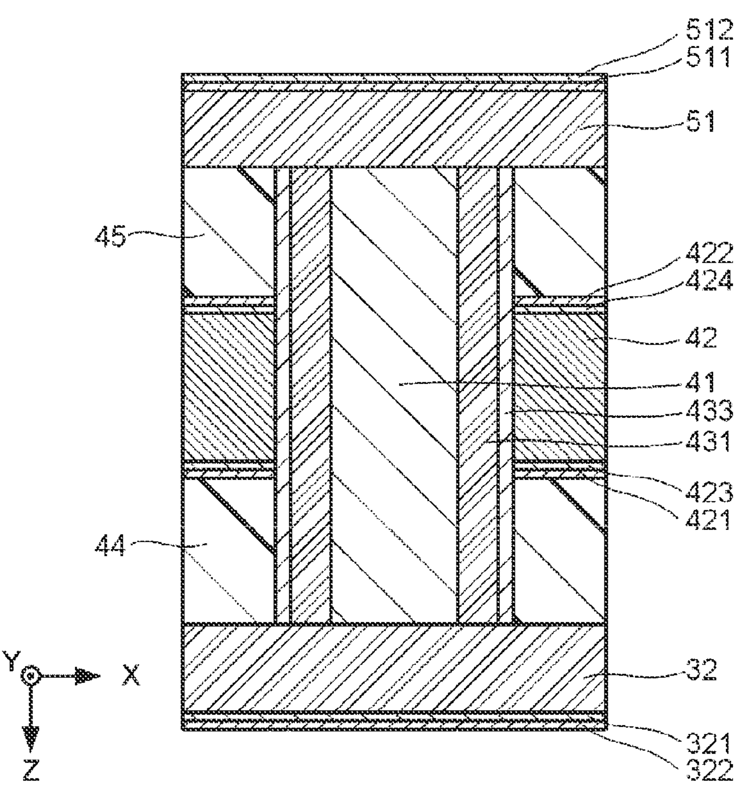
FIG. 16 is a cross-sectional schematic view illustrating a second example of a memory cell array structure.

FIG. 16 is a cross-sectional schematic view illustrating a second example of a memory cell array structure. FIG. 16 shows one portion of an X-Z section including the memory transistor MTR. Hereafter, a portion differing from the memory cell array shown in FIG. 3 will be described, while the description of FIG. 3 may be referred to as appropriate regarding other portions.

The second example of the memory cell array structure includes the insulating film 431 and the insulating film 433 instead of the insulating film 43 shown in FIG. 3, and further includes a conductive film 321, a conductive film 322, a conductive film 421, a conductive film 422, a conductive film 423, a conductive film 424, a conductive film 511, and a conductive film 512. The insulating film 431 and the insulating film 433 form a gate insulating film of the memory transistor MTR.

The insulating film 431 is provided between the oxide semiconductor layer 41 and the conductive layer 42. The insulating film 433 is provided between the conductive layer 42 and the insulating film 431. The description of the first structure example may be referred to as appropriate with regard to other descriptions of the insulating film 431 and the insulating film 433.

The conductive film 321 is provided below the conductive oxide layer 32 on one side in the Z axis direction of the oxide semiconductor layer 41. The conductive film 322 is provided below the conductive film 321. In some examples, conductive films corresponding to the conductive film 321 and the conductive film 322 may be formed between the conductive oxide layer 32 and the oxide semiconductor layer 41. The conductive film 321 and the conductive film 322 need not necessarily be formed in some examples.

The conductive film 421 is provided below the conductive layer 42, on a bottom face of the conductive layer 42 for example. The conductive film 422 is provided above the conductive layer 42, on a top face of the conductive layer 42 for example. The conductive film 423 is provided between the conductive layer 42 and the conductive film 421. The conductive film 424 is provided between the conductive layer 42 and the conductive film 422. Either one of a layered film including the conductive film 421 and the conductive film 423 and a layered film including the conductive film 422 and the conductive film 424 need not necessarily be formed.

The conductive film 511 is provided above the conductive oxide layer 51 on one side in the Z axis direction of the oxide semiconductor layer 41. The conductive film 512 is provided above the conductive film 511. In some examples, conductive films corresponding to the conductive film 511 and the conductive film 512 may be formed between the conductive oxide layer 51 and the oxide semiconductor layer 41. The conductive film 511 and the conductive film 512 need not necessarily be formed in some examples.

The conductive film 321, the conductive film 421, the conductive film 422, and the conductive film 511 have a material that can absorb hydrogen (a hydrogen absorbing material). A metal or an alloy including at least one element chosen from a group of niobium (Nb), vanadium (V), zirconium (Zr), tantalum (Ta), titanium (Ti), palladium (Pd), nickel (Ni), molybdenum (Mo), iron (Fe), and platinum (Pt) is suggested as an example of a hydrogen absorbing material. A thickness of each of the conductive film 321, the conductive film 421, the conductive film 422, and the conductive film 511 is preferably 1 nm to 10 nm.

The conductive film 322, the conductive film 423, the conductive film 424, and the conductive film 512 also have the aforementioned hydrogen absorbing material. An oxygen diffusing coefficient of the conductive film 322, the conductive film 423, the conductive film 424, and the conductive film 512 is preferably lower than that of the conductive film 321, the conductive film 421, the conductive film 422, and the conductive film 511. A thickness of each of the conductive film 322, the conductive film 423, the conductive film 424, and the conductive film 512 is preferably 1 nm to 10 nm.

A hydrogen absorbing material absorbs a portion of hydrogen from its surroundings. Because of this, the conductive film 421, the conductive film 422, the conductive film 423, and the conductive film 424 can reduce infiltration of hydrogen into the oxide semiconductor layer 41 by absorbing hydrogen in the insulating film 431, the insulating film 433, the conductive layer 42, and the like. Also, the conductive film 321, the conductive film 322, the conductive film 511, and the conductive film 512 can reduce infiltration of hydrogen into the oxide semiconductor layer 41 by absorbing hydrogen in the conductive oxide layer 32 and the conductive oxide layer 51, and absorbing hydrogen from other than the memory transistor MTR.

Also, an oxygen diffusing coefficient of a hydrogen absorbing material is lower than that of the conductive oxide layer 32 and the conductive oxide layer 51. Therefore, a loss of oxygen from the oxide semiconductor layer 41 can be limited by using a hydrogen absorbing material in at least one of the conductive film 321, the conductive film 322, the conductive film 421, the conductive film 422, the conductive film 423, the conductive film 424, the conductive film 511, and the conductive film 512.

When using palladium in the conductive film 321, the conductive film 421, the conductive film 422, and the conductive film 511, hydrogen absorption can be increased in comparison with when using palladium in combination with gold (e.g., an AuPd alloy). An oxygen diffusion coefficient can be kept low by using unalloyed palladium in the conductive film 322, the conductive film 423, the conductive film 424, and the conductive film 512. By using an alloy of gold and palladium in the conductive film 321, the conductive film 421, the conductive film 422, and the conductive film 511, and using a palladium film in the conductive film 322, the conductive film 423, the conductive film 424, and the conductive film 512, hydrogen absorption can be increased by the conductive film 321, the conductive film 421, the conductive film 422, and the conductive film 511, while oxygen can be restricted from moving between the conductive film 321, the conductive film 421, the conductive film 422, and the conductive film 511 by the conductive film 322, the conductive film 423, the conductive film 424, and the conductive film 512. Therefore, infiltration of hydrogen into the oxide semiconductor layer 41 can be more effectively restricted, while a loss of oxygen from the oxide semiconductor layer 41 can also be restricted. The order in which the conductive film 421 and the conductive film 423 are stacked may be reversed, and the order in which the conductive film 422 and the conductive film 424 are stacked may be reversed.

Figure 17:
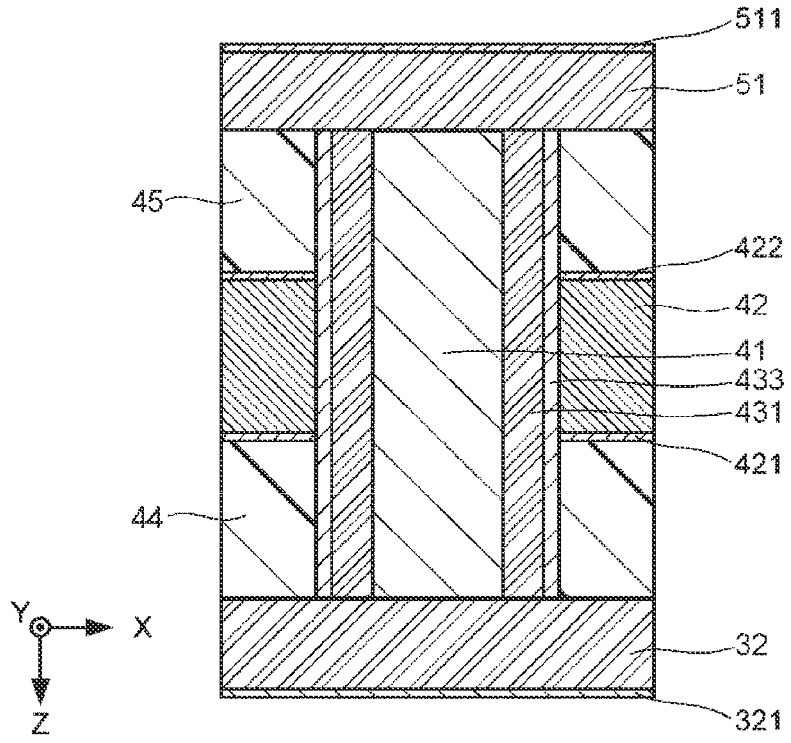
FIG. 17 is a cross-sectional schematic view illustrating the second example of the memory cell array structure.

As shown in FIG. 17, the conductive film 421 and the conductive film 422 may be formed above and below the conductive layer 42, without forming the conductive film 423 and the conductive film 424. Also, the conductive film 322 and the conductive film 512 need not necessarily be formed in some examples.

The second structure example is such that by forming a conductive film of, or including, a hydrogen absorbing material, hydrogen can be absorbed from the insulating film 431, the insulating film 433, the conductive layer 42, and the like, because of which infiltration of hydrogen into the oxide semiconductor layer 41 can be restricted. Because of this, a shift in the threshold voltage of the memory transistor MTR can be restricted.

Figures 18, 19:
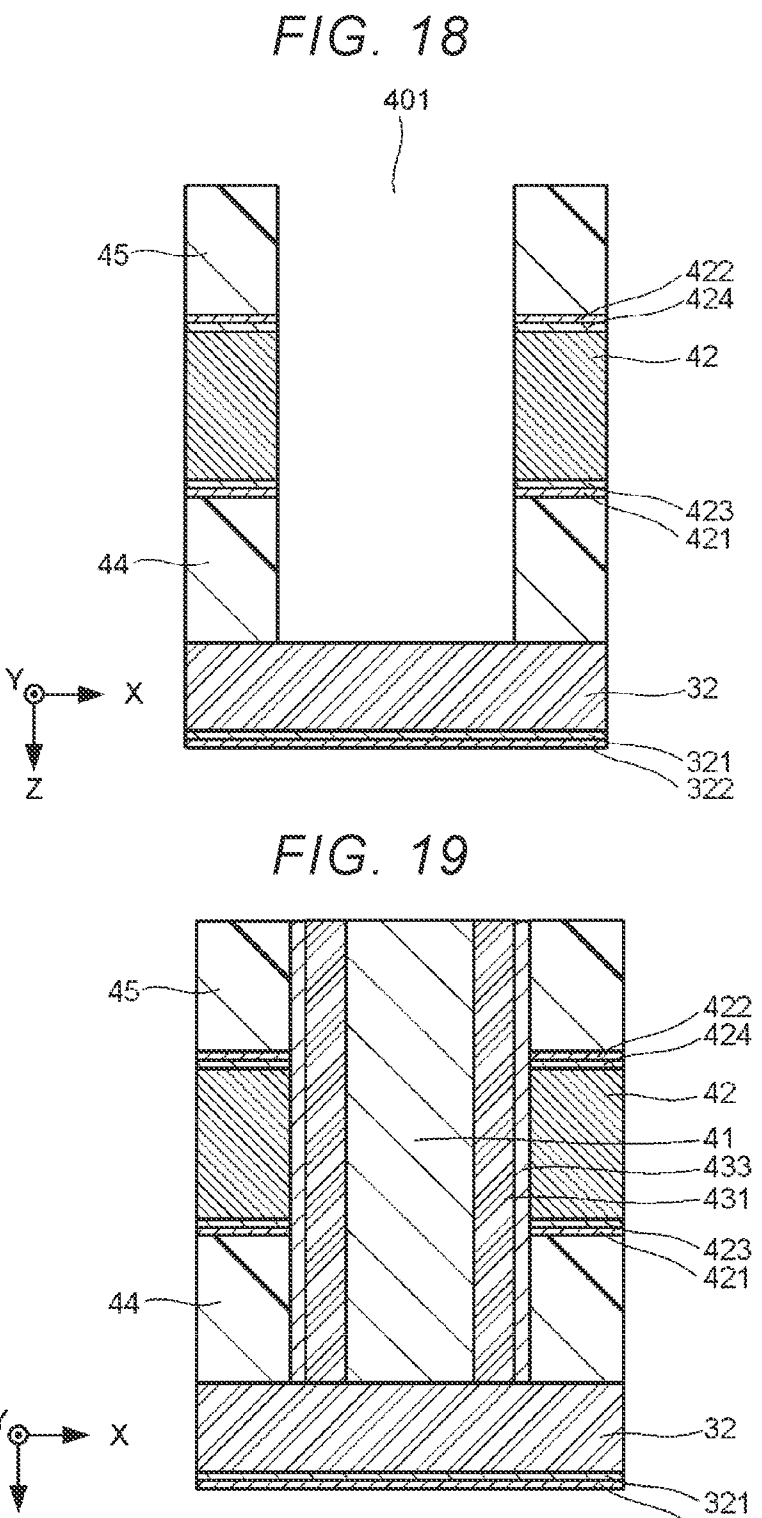
FIG. 18 is a cross-sectional schematic view illustrating an example of a method of manufacturing the second structure example.
FIG. 19 is a cross-sectional schematic view illustrating an example of a method of manufacturing the second structure example.

Next, an example of a method of manufacturing the second structure example will be described, with reference to FIGS. 18 and 19. FIGS. 18 and 19 are cross-sectional schematic views illustrating an example of a method of manufacturing the second structure example. FIGS. 18 and 19 show one portion of an X-Z section. Herein, a manufacturing process from forming the memory capacitor MCP to forming the memory transistor MTR will be described.

As shown in FIG. 18, the conductive film 322, the conductive film 321, and the conductive oxide layer 32 are formed, and the insulating layer 44, the conductive film 421, the conductive film 423, the conductive layer 42, the conductive film 424, the conductive film 422, and the insulating layer 45 are formed sequentially, after which the upper face of the conductive oxide layer 32 is caused to be partially exposed by forming the aperture 401 penetrating the layered body including these layers in the Z axis direction. The conductive oxide layer 32 can be formed using, for example, sputtering or ALD. The conductive layer 42 is formed by, after forming a conductive film using, for example, sputtering or ALD, partially removing the conductive film by, for example, an etching in which a resist mask is used. The insulating layer 44 and the insulating layer 45 are formed using, for example, CVD or ALD. The conductive film 321, the conductive film 322, the conductive film 421, the conductive film 422, the conductive film 423, and the conductive film 424 is formed by forming a conductive film using, for example, sputtering or ALD, and partially removing the conductive film by, for example, an etching in which a resist mask is used. The aperture 401 is formed by partially removing the layered body in a thickness direction by, for example, an etching in which a resist mask is used.

Next, as shown in FIG. 19, the insulating film 431, the insulating film 433, and the oxide semiconductor layer 41 are formed on the inner face of the aperture 401. The insulating film 431 and the insulating film 433 are formed by, after forming an insulating film using, for example, CVD or ALD, causing the upper face of the insulating layer 45 and the upper face of the conductive oxide layer 32 to be partially exposed by partially removing the insulating film in a thickness direction using RIE. The oxide semiconductor layer 41 is formed by, after forming an oxide semiconductor film in the aperture 401 using, for example, sputtering or ALD, causing the upper face of the insulating layer 45 to be exposed by partially removing the oxide semiconductor film in a thickness direction using RIE.

Subsequently, the conductive oxide layer 51, the conductive film 511, and the conductive film 512 are formed sequentially on the oxide semiconductor layer 41. The conductive oxide layer 51, the conductive film 511, and the conductive film 512 is formed by forming a conductive film using, for example, sputtering or ALD, and partially removing the conductive film by, for example, an etching in which a resist mask is used. The above is a description of an example of a method of manufacturing the second structure example.

Modifications of Second Structure Example

Figure 20:
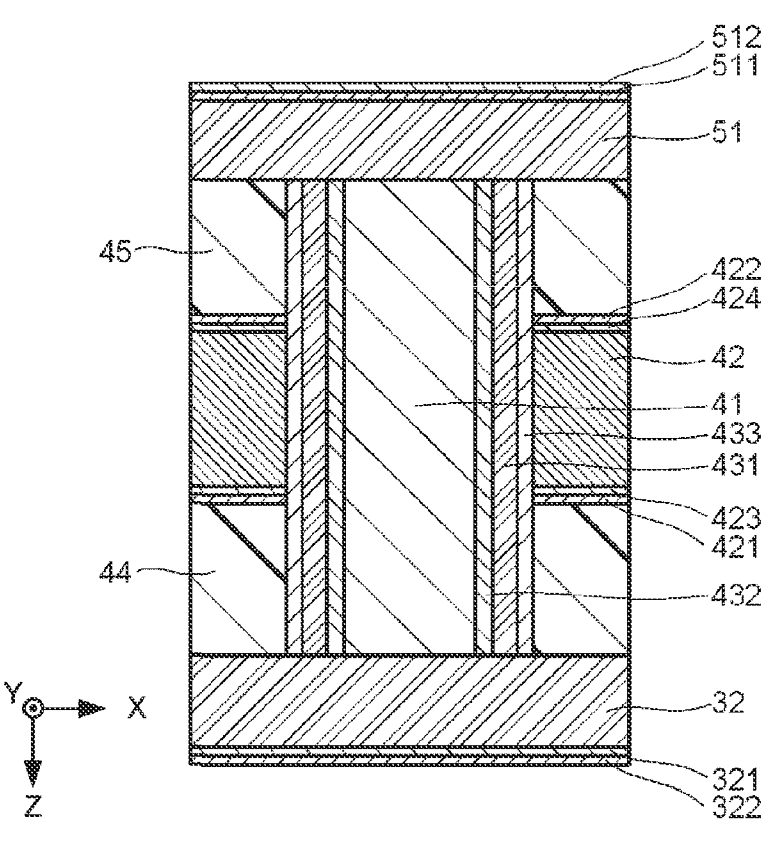
FIG. 20 is a cross-sectional schematic view illustrating a first modification of the second structure example.

The second structure example can be combined as appropriate with the first structure example. FIG. 20 is a cross-sectional schematic view illustrating a first modification of the second structure example. FIG. 20 shows one portion of an X-Z section including the memory transistor MTR. The memory cell array shown in FIG. 20 further includes, in addition to the configuration shown in FIG. 16, the insulating film 432. The insulating film 431, the insulating film 432, and the insulating film 433 form a gate insulating film of the memory transistor MTR. Hereafter, a portion differing from FIG. 16 will be described, while the description of FIG. 16 may be referred to as appropriate regarding other portions.

The insulating film 432 is provided between the oxide semiconductor layer 41 and the insulating film 431. The insulating film 432 encloses the oxide semiconductor layer 41, and is enclosed by the insulating film 431. The insulating film 432 comprises nitrogen and boron. The insulating film 432 is a film of, for example, hexagonal crystal boron nitride. The description of the first structure example may be referred to as appropriate regarding other descriptions of the insulating film 432. The example of a method of manufacturing the modification of the first structure example may be referred to as appropriate regarding a method of forming the insulating film 432.

Figure 21:
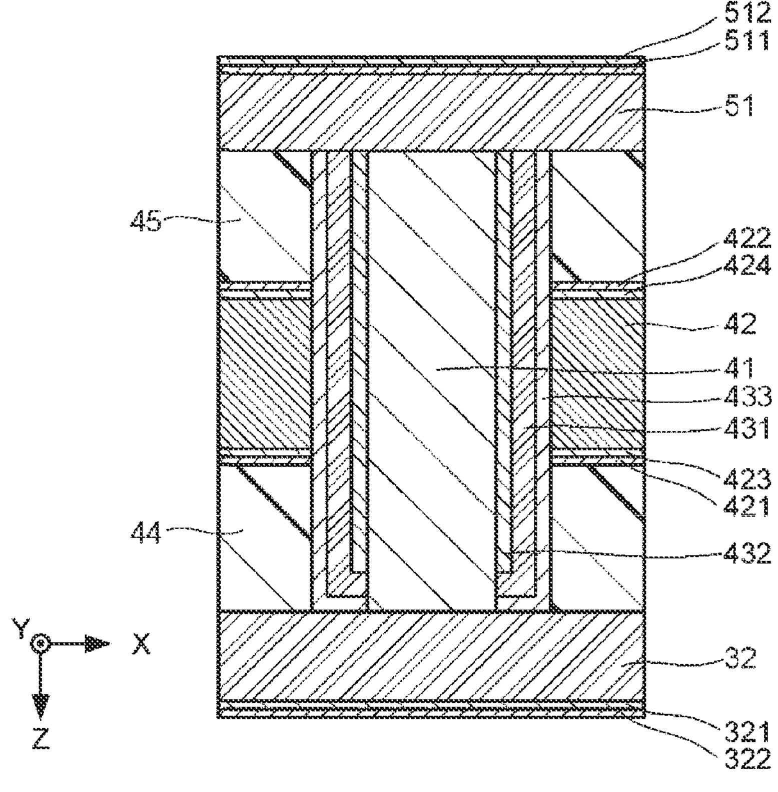
FIG. 21 is a cross-sectional schematic view illustrating the first modification of the second structure example.

The insulating film 431 and the insulating film 433 may extend in the Z axis direction between the insulating film 432 and the conductive oxide layer 32, as shown in FIG. 21. By adopting the heretofore described structure, the insulating film 431, the insulating film 432, and the insulating film 433 can be processed in the same process by being formed continuously so a manufacturing process can be simplified.

Figure 22:
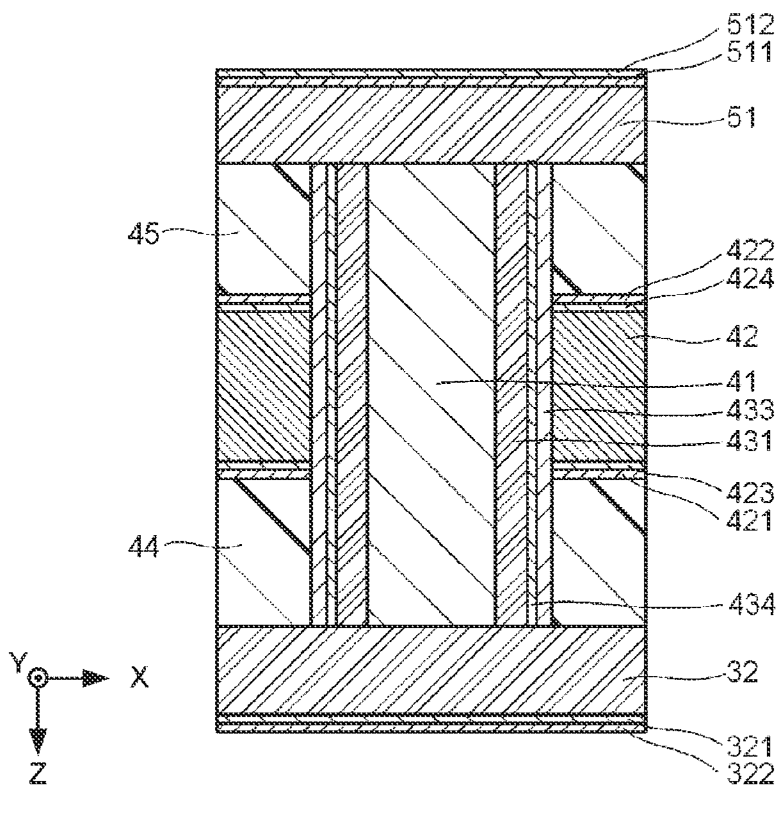
FIG. 22 is a cross-sectional schematic view illustrating a second modification of the second structure example.

FIG. 22 is a cross-sectional schematic view illustrating a second modification of the second structure example. FIG. 22 shows one portion of an X-Z section including the memory transistor MTR. The memory cell array shown in FIG. 22 further includes, in addition to the configuration shown in FIG. 16, the insulating film 434. The insulating film 431, the insulating film 432, the insulating film 433, and the insulating film 434 form a gate insulating film of the memory transistor MTR. Hereafter, a portion differing from FIG. 4 will be described, while the description of FIG. 4 may be referred to as appropriate regarding other portions.

The insulating film 434 is provided between the insulating film 431 and the insulating film 433. The insulating film 434 encloses the insulating film 431. The insulating film 434 comprises, for example, silicon, aluminum, oxygen, and nitrogen. The insulating film 434 is, for example, a film of SiAlON. The description of the modification of the first structure example may be referred to as appropriate regarding other descriptions of the insulating film 434.

Figure 23:
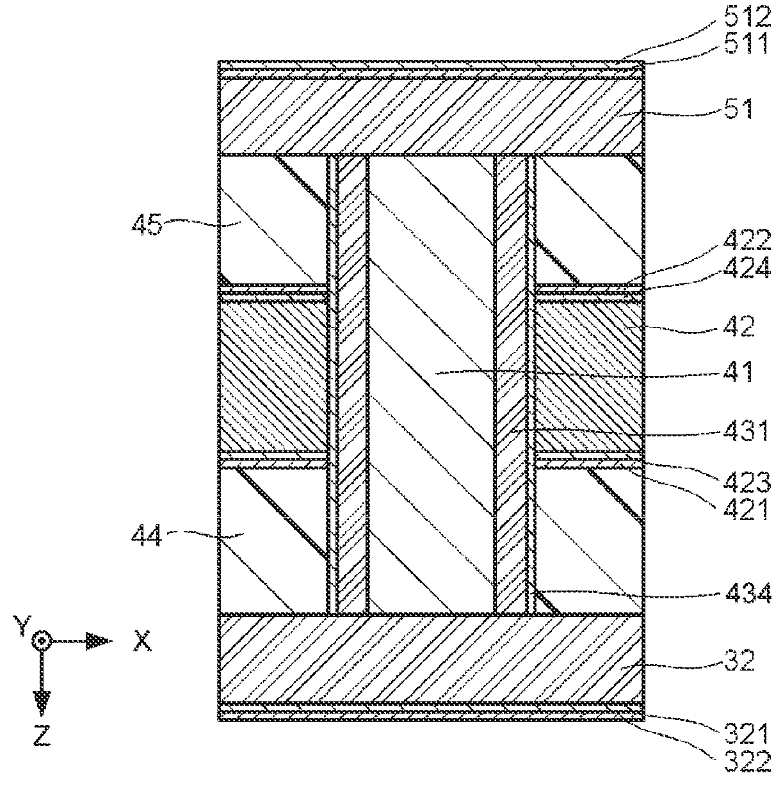
FIG. 23 is a cross-sectional schematic view illustrating the second modification of the second structure example.

The insulating film 434 may be formed between the conductive layer 42 and the insulating film 431, without forming the insulating film 433, as shown in FIG. 23. The example of a method of manufacturing the modification of the first structure example may be referred to as appropriate regarding a method of forming the insulating film 434. Furthermore, the insulating film 432 of the first modification may also be formed in the second modification of the second structure example.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a conductive layer;
an oxide semiconductor layer penetrating the conductive layer in a first direction; and
a first insulating film between the conductive layer and the oxide semiconductor layer in a second direction that intersects the first direction, wherein
the first insulating film comprises boron nitride, and
the first insulating film is hexagonal crystal boron nitride.

2. The semiconductor device according claim 1, further comprising:
a capacitor electrically connected to the oxide semiconductor layer.

3. A semiconductor device, comprising:
a conductive layer;
an oxide semiconductor layer penetrating the conductive layer in a first direction;
a first insulating film between the conductive layer and the oxide semiconductor layer in a second direction that intersects the first direction; and
a second insulating film between the conductive layer and the first insulating film in the second direction, wherein
the first insulating film comprises boron nitride, and
the second insulating film comprises silicon, aluminum, oxygen, and nitrogen.

4. The semiconductor device according to claim 3, further comprising:
a third insulating film between the oxide semiconductor layer and the conductive layer in the second direction.

5. The semiconductor device according to claim 4, further comprising:
a fourth insulating film between the oxide semiconductor layer and the conductive layer in the second direction, wherein
the second insulating film is between the third and fourth insulating films in the second direction.

6. The semiconductor device according to claim 5, wherein the fourth insulating film comprises silicon and nitrogen.

7. The semiconductor device according to claim 4, wherein the third insulating film comprises aluminum and oxygen.

8. The semiconductor device according claim 3, further comprising:
a capacitor electrically connected to the oxide semiconductor layer.

9. A semiconductor device, comprising:
a conductive layer:
an oxide semiconductor layer penetrating the conductive layer in a first direction;
a first insulating film between the conductive layer and the oxide semiconductor layer in a second direction that intersects the first direction; and
a second insulating film between the first insulating film and the oxide semiconductor layer in the second direction, wherein
the first insulating film comprises boron nitride, and
the second insulating film comprises silicon, aluminum, oxygen, and nitrogen.

10. The semiconductor device according claim 9, further comprising:
a capacitor electrically connected to the oxide semiconductor layer.

11. A semiconductor device, comprising:
a conductive layer having a first surface and a second surface on a side opposite to that of the first surface in a first direction;
an oxide semiconductor layer penetrating the conductive layer in the first direction;
a first insulating film between the conductive layer and the oxide semiconductor layer in a second direction that intersects the first direction; and
a first conductive film on at least one of the first surface and the second surface of the conductive layer, wherein
the first conductive film is a hydrogen absorbing material.

12. The semiconductor device according to claim 11, further comprising:
a second insulating film between the first insulating film and the oxide semiconductor layer or between the first insulating film and the conductive layer, wherein
the second insulating film comprises boron nitride.

13. The semiconductor device according to claim 11, further comprising:
a second insulating film between the first insulating film and the oxide semiconductor layer or between the first insulating film and the conductive layer, wherein
the second insulating film comprises silicon, aluminum, oxygen, and nitrogen.

14. The semiconductor device according to claim 11, wherein the first conductive film comprises at least one element selected from a group of niobium, vanadium, zirconium, tantalum, titanium, palladium, nickel, molybdenum, iron, and platinum.

15. The semiconductor device according to claim 11, further comprising:
a second conductive film on one side or both sides of the oxide semiconductor layer in the first direction, wherein
the second conductive film is a hydrogen absorbing material.

16. The semiconductor device according to claim 15, wherein the second conductive film comprises at least one element selected from a group of niobium, vanadium, zirconium, tantalum, titanium, palladium, nickel, molybdenum, iron, and platinum.

17. The semiconductor device according to claim 11, further comprising:
a capacitor electrically connected to the oxide semiconductor layer.

18. A semiconductor device, comprising:

a conductive layer;

an oxide semiconductor column penetrating the conductive layer in a first direction;

a first insulating film between the conductive layer and the oxide semiconductor column in a second direction that intersects the first direction; and a capacitor connected to an end of the oxide semiconductor column, wherein the first insulating film is a hexagonal crystal boron nitride.

19. The semiconductor device according to claim 18, further comprising:

a second insulating film between the conductive layer and the first insulating film in the second direction, wherein the second insulating film is silicon aluminum oxynitride.

20. The semiconductor device according to claim 19, further comprising:

a third insulating film between the oxide semiconductor column and the conductive layer in the second direction.

21. The semiconductor device according to claim 20, further comprising:

a fourth insulating film between the oxide semiconductor column and the conductive layer in the second direction, wherein the second insulating film is between the third and fourth insulating films in the second direction.

* * * * *